US012684806B2

(12) United States Patent
Hayashi

(10) Patent No.: US 12,684,806 B2
(45) Date of Patent: Jul. 14, 2026

(54) SILICON CARBIDE SEMICONDUCTOR DEVICE

(71) Applicant: FUJI ELECTRIC CO., LTD., Kawasaki (JP)

(72) Inventor: Shingo Hayashi, Matsumoto-city (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 686 days.

(21) Appl. No.: 18/072,285

(22) Filed: Nov. 30, 2022

(65) Prior Publication Data

US 2023/0223470 A1      Jul. 13, 2023

(30) Foreign Application Priority Data

Jan. 13, 2022      (JP) .................................. 2022-003712

(51) Int. Cl.

| | |
|---|---|
| *H01L 29/78* | (2006.01) |
| *H10D 30/66* | (2025.01) |
| *H10D 62/10* | (2025.01) |
| *H10D 62/832* | (2025.01) |
| *H10D 64/00* | (2025.01) |

(52) U.S. Cl.
CPC ......... *H10D 30/665* (2025.01); *H10D 30/668* (2025.01); *H10D 62/107* (2025.01); *H10D 62/8325* (2025.01); *H10D 64/111* (2025.01)

(58) Field of Classification Search
CPC ............... H10D 62/105; H10D 30/665; H10D 62/8325; H10D 30/0297; H10D 30/668; H10D 62/157; H10D 62/106; H10D 62/107; H10D 62/112
See application file for complete search history.

(56) References Cited

U.S. PATENT DOCUMENTS

| | | |
|---|---|---|
| 2003/0067033 A1 | 4/2003 | Kinoshita et al. |
| 2013/0140582 A1* | 6/2013 | Kawakami ............ H01L 21/265 |
| | | 438/529 |
| 2014/0291695 A1 | 10/2014 | Schulze et al. |

(Continued)

FOREIGN PATENT DOCUMENTS

| | | |
|---|---|---|
| JP | 2003101039 A | 4/2003 |
| JP | 2012195519 A | 10/2012 |

(Continued)

OTHER PUBLICATIONS

Office Action issued in corresponding Japanese Patent Application No. 2022-003712 dated Oct. 7, 2025.

*Primary Examiner* — Cuong B Nguyen
(74) *Attorney, Agent, or Firm* — Rabin & Berdo, P.C.

(57) ABSTRACT

A silicon carbide semiconductor device has a termination region, which includes first to fourth semiconductor regions, one provided on the outer side of another. The second semiconductor region has first small regions that are provided in a region having an impurity concentration lower than that of the first semiconductor region, and have the same impurity concentration as first semiconductor region. The third semiconductor region has a lower impurity concentration than the first semiconductor region. The fourth semiconductor region has second small regions that have the same impurity concentration as the third semiconductor region. A width of the first semiconductor region is narrower than a width of the third semiconductor region.

3 Claims, 10 Drawing Sheets

(56)                  References Cited

U.S. PATENT DOCUMENTS

2018/0308939  A1     10/2018  Yamada
2019/0140095  A1*     5/2019  Okumura ............. H10D 64/513
2020/0227549  A1      7/2020  Noborio et al.

FOREIGN PATENT DOCUMENTS

JP          2019054087  A       4/2019
JP            6610786  B2      11/2019
JP            6673856  B2       3/2020
WO          2014045480  A1       3/2014

* cited by examiner

FIG.8
RELATED ART

SILICON CARBIDE SEMICONDUCTOR DEVICE

CROSS REFERENCE TO RELATED APPLICATIONS

This application is based upon and claims the benefit of priority of the prior Japanese Patent Application No. 2022-003712, filed on Jan. 13, 2022, the entire contents of which are incorporated herein by reference.

BACKGROUND OF THE INVENTION

1. Field of the Invention

Embodiments of the invention relate to a silicon carbide semiconductor device.

2. Description of the Related Art

Conventionally, silicon (Si) is used as a material to configure power semiconductor devices that control high voltage and/or large current. Power semiconductor devices include various types such as insulated gate bipolar transistors (IGBTs), and metal oxide semiconductor field effect transistors (MOSFETs) that have insulated gates (MOS gates) having a 3-layer structure including a metal, an oxide film, and a semiconductor; these devices are selectively used according to an intended purpose.

For example, bipolar transistors and IGBTs have high current density compared to MOSFETs and can be adapted for large current but cannot be switched at high speeds. In particular, the limit of switching frequency is about several kHz for bipolar transistors and about several tens of kHz for IGBTs. On the other hand, power MOSFETs have low current density compared to bipolar transistors and IGBTs and are difficult to adapt for large current but can be switched at high speeds up to about several MHz.

Nonetheless, there is a strong demand in the market for large-current, high-speed power semiconductor devices and thus, IGBTs and power MOSFETs have been intensively developed and improved, and the performance of power devices has substantially reached the theoretical limit determined by the material. Therefore, in terms of power semiconductor devices, semiconductor materials to replace silicon have been investigated and silicon carbide (SiC) has been focused on as a semiconductor material enabling fabrication (manufacture) of next-generation power semiconductor devices having low ON voltage, high-speed characteristics, and high-temperature characteristics.

SiC is a very stable semiconductor material chemically, has a wide bandgap of 3 eV, and can be used very stably as a semiconductor material even at high temperatures. Further, SiC has a critical electric field strength that is at least ten times that of silicon and therefore, is expected to be a semiconductor material capable of sufficiently reducing ON resistance. Such characteristics of silicon carbide are also applicable to other semiconductors having a bandgap wider than a bandgap of silicon (hereinafter, wide bandgap semiconductors) such as gallium nitride (GaN). Thus, use of a wide bandgap semiconductor enables increases in the breakdown voltage of semiconductor devices.

In such high-voltage semiconductor devices, when a device element structure is formed and is in an on state, current flows not only through an active region but also high voltage is applied to an edge termination region that surrounds a periphery of the active region and sustains a withstand voltage, and electric field concentrates in the edge termination region. The withstand voltage of a high-voltage semiconductor device is determined by the impurity concentration, thickness, and electric field strength of the semiconductor and in this manner, the destruction tolerance, which is determined by characteristics unique to the semiconductor, is equal in the active region and the edge termination region. Therefore, due to electric field concentrating in the edge termination region, electrical load exceeding the destruction tolerance may be applied to the edge termination region, whereby destruction may occur. In other words, the withstand voltage of the high-voltage semiconductor device is rate-limited by the destruction tolerance of the edge termination region.

For a device in which the overall withstand voltage of the high-voltage semiconductor device is enhanced by mitigating or distributing the electric field of the edge termination region, voltage withstanding structures are commonly known such as junction termination extension (JTE) structures, field limiting ring (FLR) structures, spatial modulation structures in which the impurity concentration distribution decreases in an outward direction. Further, a semiconductor device is commonly known in which a floating metal electrode in contact with a FLR is disposed as a field plate (FP), and charge generated in the edge termination region is discharged thereby, enhancing reliability.

A voltage withstanding structure of a conventional high voltage silicon carbide semiconductor device is described taking, as an example, a MOSFET that includes a JTE structure and a spatial modulation structure. FIG. 6 is a cross-sectional view depicting a structure of a conventional silicon carbide semiconductor device.

A conventional silicon carbide semiconductor device 170 depicted in FIG. 6 has on a semiconductor base (hereinafter, silicon carbide base (semiconductor chip)) that contains silicon carbide, an active region 150 and an edge termination region 160 that surrounds a periphery of the active region 150. The silicon carbide base is formed by sequentially stacking an n-type epitaxial layer 108 containing silicon carbide, an $n^{++}$-type epitaxial layer 109 containing silicon carbide, an $n^-$-type drift region 102 containing silicon carbide, and a p-type base region 105 containing silicon carbide, on a front surface of an $n^+$-type starting substrate (hereinafter, $n^*$-type silicon carbide substrate) 101 containing silicon carbide.

Further, in the $n^-$-type drift region 102, an n-type partial region 103 and the $p^+$-type partial region 104 are provided. The $p^+$-type partial region 104 is formed by a lower $p^+$-type partial region 104b and an upper $p^+$-type partial region 104a. In the p-type base region 105, $n^{++}$-type source regions (not depicted) and $p^{++}$-type contact regions 106 are provided.

While not depicted in FIG. 6, a MOS gate (insulated gate formed by a metal, an oxide film, and a semiconductor) structure having a trench structure is provided in the active region 150, in a front side (side having the p-type base region 105) of the silicon carbide base. On the $n^{++}$-type source regions and the $p^{++}$-type contact regions 106, a source electrode 116 is provided via a barrier metal 115, and a polyimide 130 that functions as a protective film is provided on a surface of the conventional silicon carbide semiconductor device 170. On a back surface of the $n^+$-type silicon carbide substrate 101, a drain electrode 117 is provided.

At an end of the active region 150, a polysilicon layer 122 is provided on the $p^{++}$-type contact regions 106, via a high-temperature oxide (HTO) film 112.

In the edge termination region 160, a gate runner 118 that connects the polysilicon layer 122 and a gate pad electrode (not depicted) is provided. In the edge termination region 160, which is closer to the chip end than is the region in which the gate runner 118 is provided, the p-type base region 105 is removed, thereby forming at a front surface of the silicon carbide base, a recess whereby the edge termination region 160 is lower than the active region 150 (is recessed toward a drain) and at a bottom of the recess, the n⁻-type drift region 102 is exposed. The edge termination region 160 is covered by a field oxide film 110, and on the field oxide film 110, the HTO film 112 and an interlayer insulating film 114 are sequentially deposited. Further, in the edge termination region 160, a spatial modulation JTE structure 131 described with reference to FIG. 7 is provided. Further, an n⁺⁺-type channel stopper region 121 that functions as a channel stopper is provided closer to the chip end than is the spatial modulation JTE structure 131.

Here, in an edge termination structure with a FLR, when an impurity concentration of a p-type region of the FLR is increased, a length of the edge termination structure becomes about twice that of the spatial modulation structure. Further, in an edge termination structure with only a JTE structure, a portion having high electric field at the surface is generated. Therefore, in a high voltage silicon carbide semiconductor device, for cost reduction and reliability of characteristics, an edge termination structure that combines a spatial modulation structure and a JTE structure is used (for example, refer to Japanese Laid-Open Patent Publication No. 2012-195519 and Japanese Patent No. 6610786).

FIG. 7 is a cross-sectional view depicting an edge termination structure that is a combination of a spatial modulation structure and a JTE structure of a conventional silicon carbide semiconductor device. The structure (hereinafter, the spatial modulation JTE structure 131) that combines a spatial modulation structure and a JTE structure is a structure in which spatial modulation regions (a first spatial modulation region 128, a second spatial modulation region 129) are disposed between p-type regions (a p⁻-type JTE region 119, a p⁻⁻-type JTE region 120) that are adjacent to each other and configure the JTE structure, the spatial modulation regions each having an impurity concentration distribution that is spatially equivalent to an intermediate impurity concentration between said adjacent p-type regions; and an overall impurity concentration distribution of the JTE structure gradually decreases in an outward direction (direction toward the chip end). FIG. 7 depicts an example in which the first spatial modulation region 128 is disposed closer to the chip end than is the p⁻-type JTE region 119, and the second spatial modulation region 129 is disposed closer to the chip end than is the p⁻⁻-type JTE region 120. A spatial modulation region may be disposed in the p⁻-type JTE region 119, or may be disposed in both the p⁻-type JTE region 119 and the p⁻⁻-type JTE region 120, or may be disposed between the p⁻-type JTE region 119 and the p⁻⁻-type JTE region 120.

The spatial modulation region configuring the spatial modulation JTE structure 131 is formed by adjacently disposing two small regions to repeatedly alternate each other in a predetermined pattern, each of the two small regions having an impurity concentration that is substantially the same as that of regions on both sides of the spatial modulation region. In the example depicted in FIG. 7, in the first spatial modulation region 128, regions of substantially a same impurity concentration as that of the p⁻-type JTE region 119 are disposed adjacently to one another at increasingly larger intervals the closer the region is to the chip end;

and in the second spatial modulation region 129, regions of substantially a same impurity concentration as that of the p⁻⁻-type JTE region 120 are disposed adjacently to one another at increasingly larger intervals the closer the region is to the chip end.

In the example depicted in FIG. 7, the p⁻-type JTE region 119 has a width of 14 μm, and in the first spatial modulation region 128, four small regions, respectively, having widths of 4.6 μm, 1.6 μm, 2.2 μm, and 2.5 μm are disposed, respectively, 1.5 μm, 1.8 μm, 1.8 μm, and 4 μm from the region adjacent thereto. Further, the p⁻⁻-type JTE region 120 has a width of 10 μm, and in the second spatial modulation region 129, four small regions, respectively, having width of 4.6 μm, 1.6 μm, 2.2 μm, and 2.5 μm are disposed, respectively, 1.5 μm, 1.8 μm, 1.8 μm, and 4 μm from the region adjacent thereto. An interval between the second spatial modulation region 129 and the n⁺⁺-type channel stopper region 121 is 10 μm. Therefore, the conventional edge termination region 160 has a length (length from an end of the p⁺-type partial region 104 to an end (end facing the active region 150) of the n⁺⁺-type channel stopper region 121) that is 74 μm.

The overall spatial impurity concentration distribution of the spatial modulation region is determined by a ratio of the width and the impurity concentration of the two small regions. Compared to a general JTE structure without a spatial modulation region, the spatial modulation JTE structure 131 is able to ensure a more stable predetermined withstand voltage.

Further, a silicon carbide semiconductor device is commonly known that includes a silicon carbide substrate and an inorganic passivation layer structure in which a main surface of the silicon carbide substrate is at least partially covered in a lateral direction; and the silicon carbide substrate and an inorganic passivation layer are configured so that at least one region of the silicon carbide substrate includes electric field of at least 2.3 MV/cm while electric field at the surface of the inorganic passivation layer structure disposed facing the silicon carbide substrate is less than 500 kV/cm (for example, refer to Japanese Patent No. 6673856).

SUMMARY OF THE INVENTION

According to an embodiment of the invention, a silicon carbide semiconductor device, includes: a silicon carbide semiconductor substrate of a first conductivity type, having an active region through which a main current flows and a termination region that surrounds a periphery of the active region in a top view of the silicon carbide semiconductor device; and a first semiconductor region, a second semiconductor region, a third semiconductor region, and a fourth semiconductor region, all formed in the termination region. The first semiconductor region is of a second conductivity type. The second semiconductor region is of the second conductivity type, and is provided on an outer side of the first semiconductor region in the top view, the second semiconductor region having an impurity concentration that is lower than an impurity concentration of the first semiconductor region, the second semiconductor region having a plurality of first small regions of the second conductivity type, the plurality of first small regions having a same impurity concentration as the impurity concentration of the first semiconductor region. The third semiconductor region is of the second conductivity type, and is provided on an outer side of the second semiconductor region in the top view, the third semiconductor region having an impurity concentration that is lower than the impurity concentration of the first semiconductor region. The fourth semiconductor region is of the second conductivity type, and is provided on an outer side of the third semiconductor region in the top view, the fourth semiconductor region having a plurality of second small regions of the second conductivity type, the plurality of second small regions having a same impurity concentration as the impurity concentration of the third semiconductor region. The first semiconductor region has a width that is narrower than a width of the third semiconductor region.

Objects, features, and advantages of the present invention are specifically set forth in or will become apparent from the following detailed description of the invention when read in conjunction with the accompanying drawings.

BRIEF DESCRIPTION OF THE DRAWINGS

FIG. 8 is figure depicting a site of breakdown after a THB test of the conventional silicon carbide semiconductor device.

DETAILED DESCRIPTION OF THE INVENTION

Figure 1:
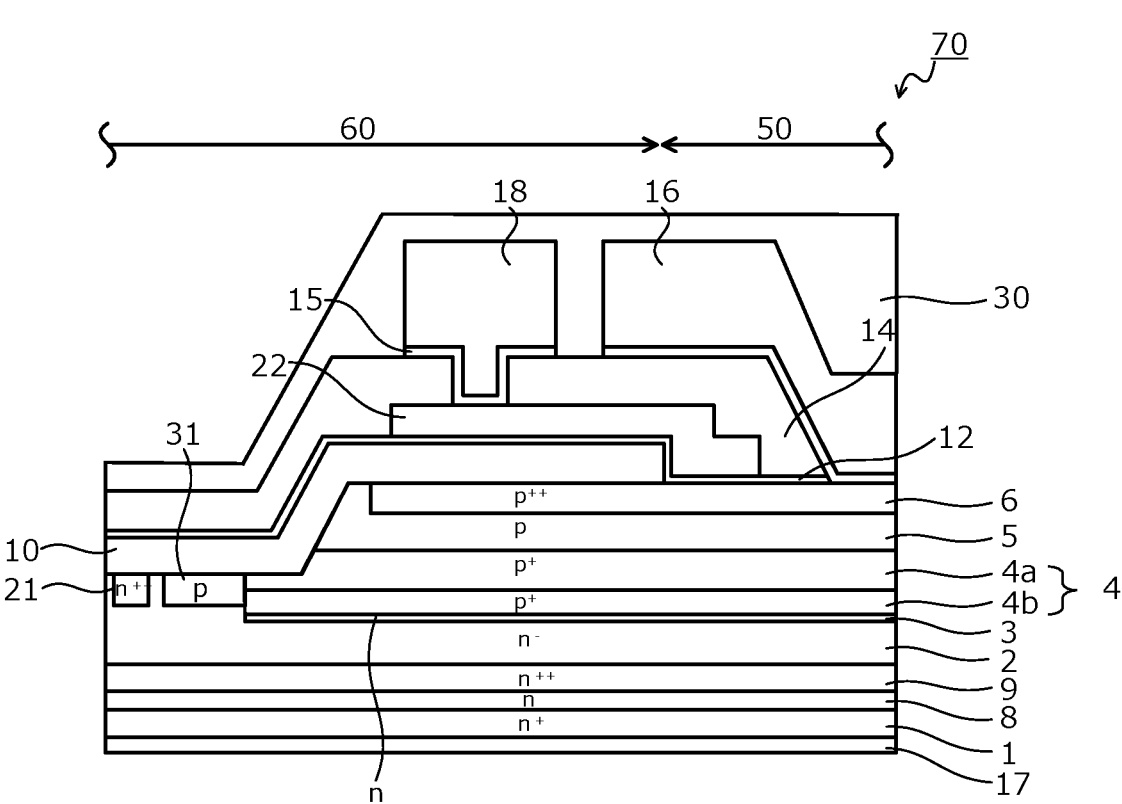
FIG. 1 is a cross-sectional view depicting a structure of a silicon carbide semiconductor device according to an embodiment.

First, problems associated with the conventional techniques are discussed. In the conventional silicon carbide semiconductor device, degradation may occur with a temperature humidity bias (THB) test of a particular package. For example, for a thin resin product in which a thickness of the polyimide 130 is reduced from a normal 8 mm to 4 mm and the THB test is performed under a temperature of 85 degrees C., a humidity of 85%, Vgs=0V, and Vds=960V, with a target value of 1000 hours, breakdown occurs at about 410 hours to 750 hours.

Figure 8:
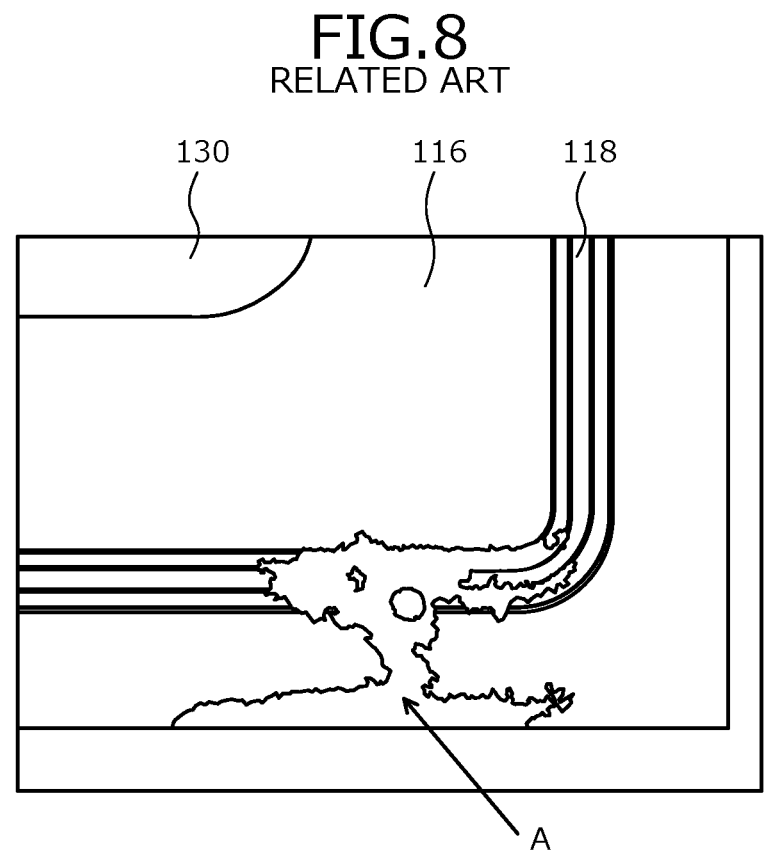

FIG. 8 is figure depicting a site of breakdown after the THB test of the conventional silicon carbide semiconductor device. In FIG. 8, an area indicated by arrow A is a site of breakdown. As depicted in FIG. 8, destruction above the gate runner 118 occurs from the chip end. This is to be due to the electric field of the surface (the HTO film 112/the polyimide 130 interface) being 0.5 MV/cm or more.

Embodiments of a silicon carbide semiconductor device according to the present invention are described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. Cases where symbols such as n's and p's that include + or − are the same indicate that concentrations are close and therefore, the concentrations are not necessarily equal. In the description of the embodiments below and the accompanying drawings, main portions that are identical will be given the same reference numerals and will not be repeatedly described. Further, in the present description, when Miller indices are described, "−" means a bar added to an index immediately after the "−", and a negative index is expressed by prefixing "−" to the index.

Figure 2:
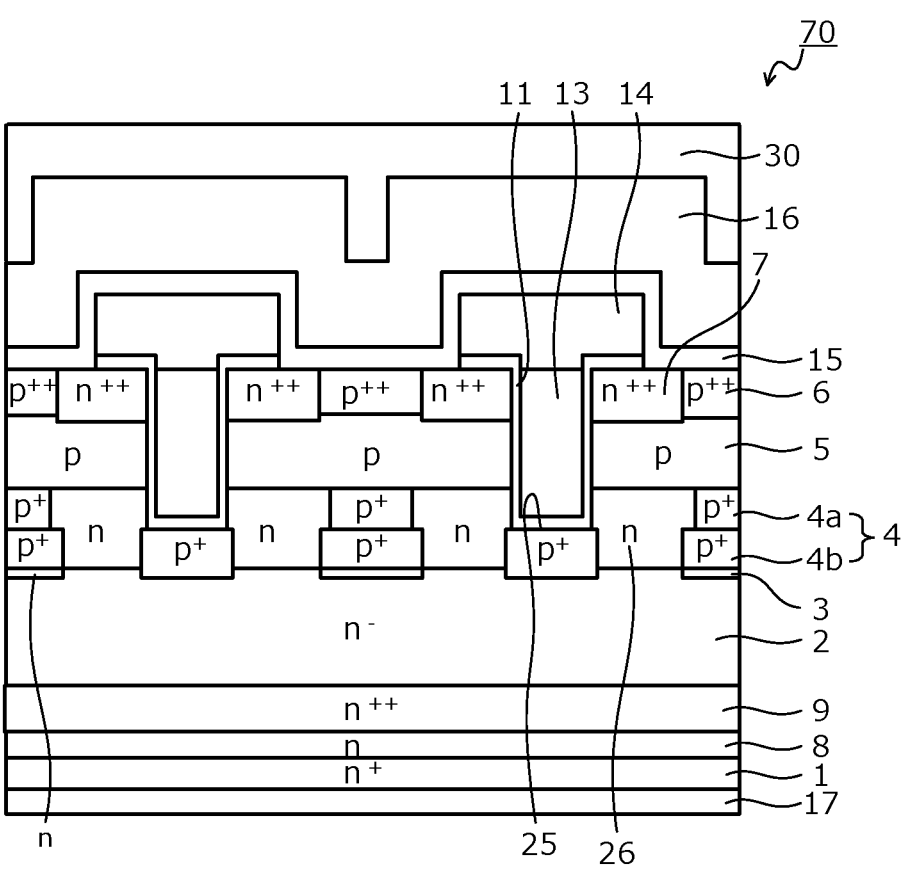
FIG. 2 is a cross-sectional view depicting a MOS structure of the silicon carbide semiconductor device according to the embodiment.

A semiconductor device according to the present invention is configured using a wide bandgap semiconductor. In an embodiment, a silicon carbide semiconductor device fabricated using, for example, silicon carbide (SiC) as the wide bandgap semiconductor is described taking a MOSFET as an example. FIG. 1 is a cross-sectional view depicting a structure of the silicon carbide semiconductor device according to the embodiment. FIG. 2 is a cross-sectional view depicting a MOS structure of the silicon carbide semiconductor device according to the embodiment.

As depicted in FIGS. 1 and 2, a silicon carbide semiconductor device 70 according to the embodiment includes an active region 50 and an edge termination region 60 that surrounds a periphery of the active region 50 on a semiconductor base (hereinafter, silicon carbide base (semiconductor substrate (semiconductor chip))) that contains silicon carbide. The active region 50 is a region through which current flows during an on state. The edge termination region 60 is a region that mitigates electric field in a front side of a drift region and sustains a withstand voltage. FIG. 1 depicts an end of the active region 50 and a structure of the edge termination region 60; FIG. 2 depicts the MOS structure of the active region 50.

The silicon carbide base is formed by sequentially stacking on a front surface of an $n^+$-type starting substrate ($n^+$-type silicon carbide substrate, silicon carbide semiconductor substrate of a first conductivity type) 1 containing silicon carbide, an n-type epitaxial layer 8 containing silicon carbide, an $n^{++}$-type epitaxial layer 9 containing silicon carbide, an $n^-$-type drift region (first silicon carbide semiconductor layer of the first conductivity type) 2 containing silicon carbide, and a p-type base region 5 containing silicon carbide. The $n^+$-type silicon carbide substrate 1 functions as a drain region.

The $n^+$-type silicon carbide substrate 1 is a silicon carbide single crystal substrate. An impurity concentration of the $n^-$-type drift region 2 is lower than an impurity concentration of the $n^+$-type silicon carbide substrate 1 and, for example, is a low-concentration n-type drift layer. Between the $n^-$-type drift region 2 and the $n^+$-type silicon carbide substrate 1, the n-type epitaxial layer 8 and the $n^{++}$-type epitaxial layer 9 may be provided. The n-type epitaxial layer 8 and the $n^{++}$-type epitaxial layer 9 each constitute a buffer layer that reduces growth of crystal defects from the $n^+$-type silicon carbide substrate 1. Further, at a first surface of the $n^-$-type drift region 2, an n-type high-concentration region 26 may be provided, the first surface of the $n^-$-type drift region 2 being opposite to a second surface thereof facing the n⁺-type silicon carbide substrate 1. The n-type high-concentration region 26 is a high-concentration n-type drift layer having an impurity concentration that is lower than the impurity concentration of the n⁺-type silicon carbide substrate 1 and higher than the impurity concentration of the n⁻-type drift region 2.

At the first surface of the n⁻-type drift region 2, the p-type base region 5 is provided. The p-type base region 5 is ion-implanted so as to have an impurity concentration that is, for example, 3.5×10¹⁷/cm³, and 5×10¹⁷/cm³ at portions.

At a second main surface (back surface, i.e., back surface of the silicon carbide base) of the n⁺-type silicon carbide substrate 1, a drain electrode 17 constituting a back electrode is provided. On a surface of the drain electrode 17, a drain electrode pad (not depicted) is provided.

In a first side of the silicon carbide base (side having the p-type base region 5), a trench structure is formed. In particular, from a surface of the p-type base region 5, that faces a first main surface of the silicon carbide base and is opposite to that facing the n⁺-type silicon carbide substrate 1, trenches 25 penetrate through the p-type base region 5 and reach the n-type high-concentration region 26 (in an instance in which the n-type high-concentration region 26 is omitted, the n⁻-type drift region 2, hereinafter, indicated as simply "(2)").

Along inner walls of the trenches 25, a gate insulating film 11 is formed along bottoms and sidewalls of the trenches 25, and in the trenches 25, gate electrodes 13 are formed on the gate insulating film 11. The gate insulating film 11 insulates the gate electrodes 13 from the n-type high-concentration region 26 (2) and the p-type base region 5. A portion of each of the gate electrodes 13 may protrude toward a source electrode 16 from an upper portion of the trenches 25, the upper portion facing the later-described source electrode 16.

In the n-type high-concentration region 26 (2), at a surface thereof facing the first main surface of the silicon carbide base and opposite to that facing the n⁺-type silicon carbide substrate 1, p⁺-type upper portion regions 4a are provided. The p⁺-type upper portion regions 4a, for example, are provided between the trenches 25. Further, in the n-type high-concentration region 26 (2), p⁺-type lower portion regions 4b are provided in contact with bottoms of the trenches 25 and bottoms of the p⁺-type upper portion regions 4a. The p⁺-type lower portion regions 4b that are in contact with the bottoms of the trenches 25 are provided at positions facing the bottoms of the trenches 25 in a depth direction (direction from the source electrode 16 to the back electrode). The p⁺-type upper portion regions 4a and the p⁺-type lower portion regions 4b between the trenches 25 combined constitute p⁺-type portion regions 4.

A width of the p⁺-type lower portion regions 4b is at least equal to a width of the trenches 25. Further, a width of the p⁺-type lower portion regions 4b is at least equal to a width of the p⁺-type upper portion regions 4a. An impurity concentration of the p⁺-type portion regions 4, for example, is 6.5×10¹⁸/cm³. The bottoms of the trenches 25 may reach the p⁺-type lower portion regions 4b or may be positioned in the n-type high-concentration region 26 (2) sandwiched between the p-type base region 5 and the p⁺-type lower portion regions 4b.

Further, in the n⁻-type drift region 2, n-type portion regions 3 that have a peak impurity concentration that is higher than that of the n-type high-concentration region 26 (2) are provided at positions deeper than are the p⁺-type lower portion regions 4b that are between the trenches 25. A deep position is a position closer to the drain electrode 17 than are the p⁺-type lower portion regions 4b.

In the p-type base region 5, at the surface thereof facing the first main surface of the silicon carbide base, n⁺⁺-type source regions 7 and p⁺⁺-type contact regions 6 are selectively provided. Further, the n⁺⁺-type source regions 7 and the p⁺⁺-type contact regions 6 are in contact with one another. An impurity concentration of the n⁺⁺-type source regions 7 is, for example, 3×10¹⁹/cm³. An impurity concentration of the p⁺⁺-type contact regions 6 is, for example, 3×10²⁰/cm³.

An interlayer insulating film 14 is provided at the first side of the silicon carbide base, so as to cover the gate electrodes 13 embedded in the trenches 25. The source electrode 16 is in contact with the n⁺⁺-type source regions 7 and the p⁺⁺-type contact regions 6 via contact holes opened in the interlayer insulating film 14. The source electrode 16 is electrically insulated from the gate electrodes 13 by the interlayer insulating film 14. On the source electrode 16, a source electrode pad (not depicted) is provided. Between the source electrode 16 and the interlayer insulating film 14, for example, a barrier metal 15 that prevents diffusion of metal atoms from the source electrode 16 to the gate electrodes 13 may be provided. A polyimide 30 functioning as a protective film may be provided on the surface of the silicon carbide semiconductor device 70. In FIG. 2, while only two MOS gate (insulated gate formed by a metal, an oxide film, and a semiconductor) structures are depicted, more MOS gate structures may be disposed in parallel in the active region 50.

At the end of the active region 50, between the source electrode 16 and the silicon carbide base (for example, the p⁺⁺-type contact regions 6), an HTO film 12 and the interlayer insulating film 14 are provided. The end of the active region 50 is a portion of the active region 50, that is in contact with the edge termination region 60 and in particular, is a portion where the interlayer insulating film 14 is provided between the source electrode 16 and the silicon carbide base.

A polysilicon layer 22 is partially provided on the HTO film 12 at the end of the active region 50, the polysilicon layer 22 being electrically connected to a later-described gate runner 18.

In the edge termination region 60 as well, the n-type epitaxial layer 8, the n⁺⁺-type epitaxial layer 9, the n⁻-type drift region 2, the n-type high-concentration region 26, the p-type base region 5, the n-type portion regions 3, the p⁺-type upper portion regions 4a, and the p⁺-type lower portion regions 4b described above are provided on the front surface of the n⁺-type silicon carbide substrate 1.

Figure 3A:
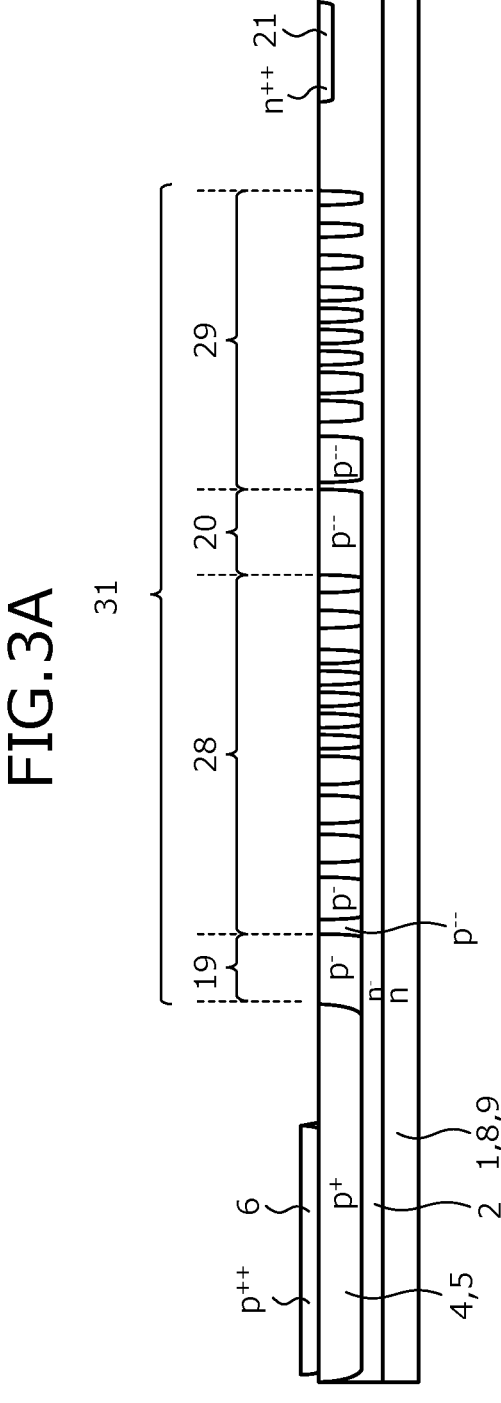
FIG. 3A is a cross-sectional view depicting an edge termination structure of the silicon carbide semiconductor device according to the embodiment.
Figure 3B:
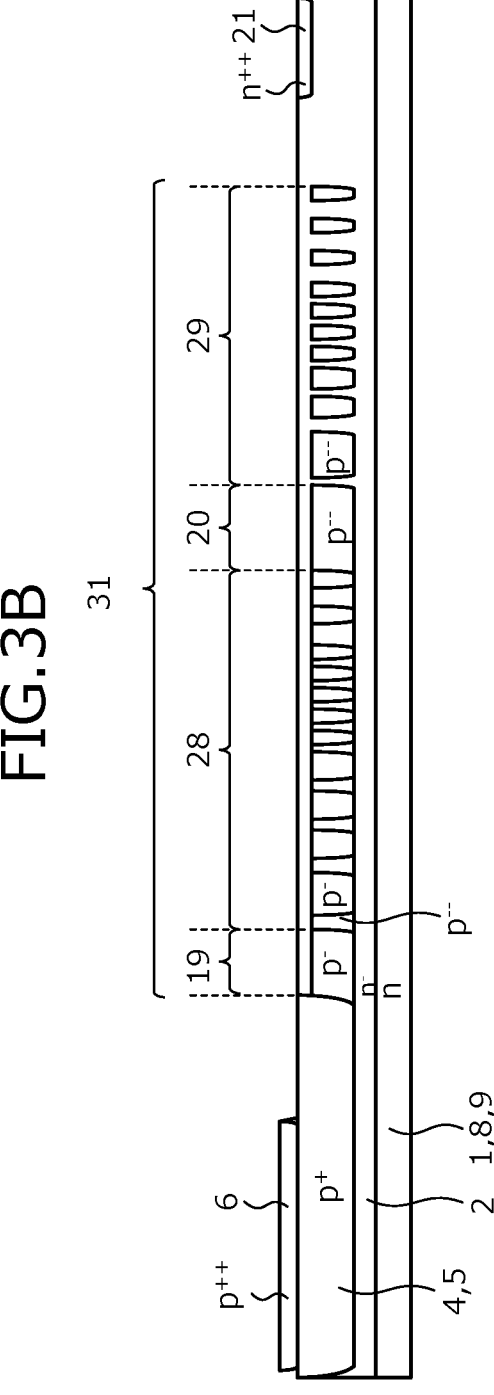
FIG. 3B is a cross-sectional view depicting the edge termination structure of the silicon carbide semiconductor device according to the embodiment.
Figure 3C:
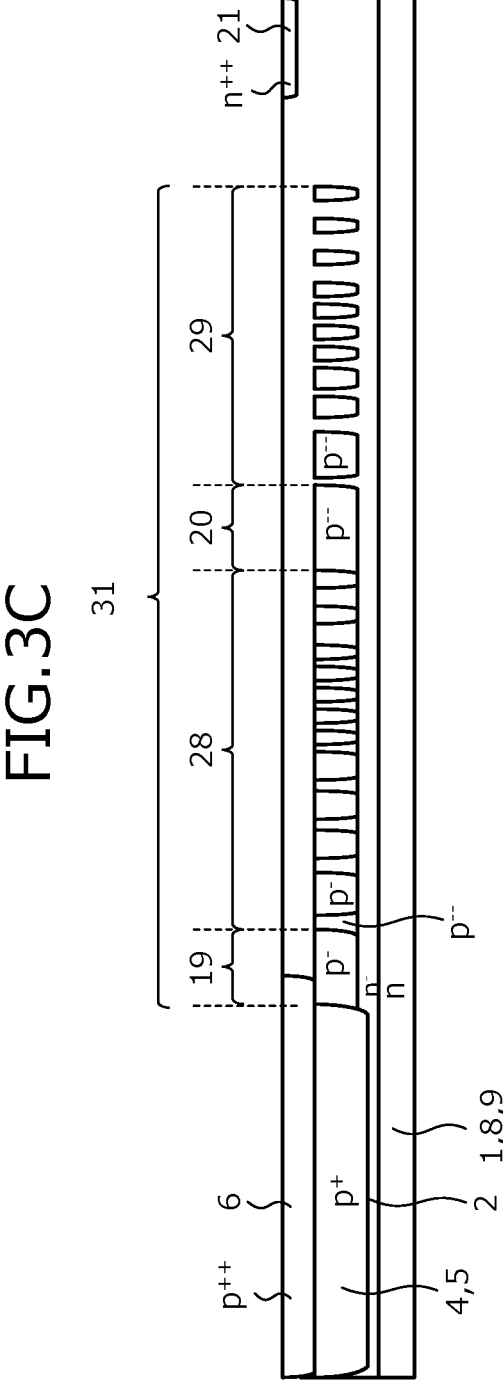
FIG. 3C is a cross-sectional view depicting the edge termination structure of the silicon carbide semiconductor device according to the embodiment.

In the edge termination region 60, the gate runner 18 that connects the polysilicon layer 22 and the gate pad electrode are provided. In the edge termination region 60, in an outer portion thereof, for example, a portion other than regions where the gate runner 18 is provided, the p-type base region 5, the n-type portion regions 3, the p⁺-type upper portion regions 4a, and the p⁺-type lower portion regions 4b are removed, thereby forming a recess where a portion of the front surface of silicon carbide base in the edge termination region 60 is lower than a portion of the front surface of silicon carbide base in the active region 50 (is recessed toward the drain) and at a bottom of the recess, the n⁻-type drift region 2 is exposed. Further, in the edge termination region 60, a spatial modulation JTE structure 31 described in detail below with reference to FIGS. 3A, 3B, and 3C is provided. Further, on an outer side (end facing the chip end) of the spatial modulation JTE structure 31, an n⁺⁺-type channel stopper region 21 that functions as a channel stopper is provided. High voltage in the lateral direction is sustained by pn junctions between the spatial modulation JTE structure 31 and the n⁻-type drift region 2.

The edge termination region 60 is covered by a field oxide film 10 and on the field oxide film 10, the HTO film 12 and the interlayer insulating film 14 are sequentially deposited.

FIGS. 3A, 3B, and 3C are cross-sectional views depicting an edge termination structure of the silicon carbide semiconductor device according to the embodiment. As depicted in FIGS. 3A, 3B, and 3C, the spatial modulation JTE structure 31 is a structure that combines a spatial modulation structure and a JTE structure, i.e., a structure in which in p-type regions (a p⁻-type JTE region 19, a p⁻⁻-type JTE region 20) configuring the JTE structure, and regions (a first spatial modulation region 28, a second spatial modulation region 29) having an impurity concentration distribution that is spatially equivalent to an intermediate impurity concentration between the impurity concentrations of the two p-type regions are disposed, whereby an overall impurity concentration distribution of the JTE structure gradually decreases in an outward direction (direction to the chip end). FIGS. 3A, 3B, and 3C depict examples in which the first spatial modulation region 28 is disposed on the outer side of the p⁻-type JTE region 19 and the second spatial modulation region 29 is disposed on the outer side of the p⁻⁻-type JTE region 20. The spatial modulation regions may be disposed in the p⁻-type JTE region 19, may be disposed in both the p⁻-type JTE region 19 and the p⁻⁻-type JTE region 20, or may be disposed between the p⁻-type JTE region 19 and the p⁻⁻-type JTE region 20. While not depicted, the p⁻-type JTE region 19 and the p⁻⁻-type JTE region 20 are disposed in circular concentric shapes that surround the periphery of the active region 50.

The spatial modulation regions configuring the spatial modulation JTE structure 31 are formed by two small regions that have a substantially same impurity concentration as that of both regions adjacent thereto, the two small regions being disposed repeatedly alternating each other in a predetermined pattern. In the examples depicted in FIGS. 3A, 3B, and 3C, in the first spatial modulation region 28, multiple regions of substantially the same impurity concentration as that of the p⁻-type JTE region 19 are disposed adjacently to one another at increasingly larger intervals the closer the region is to the chip end; and in the second spatial modulation region 29, multiple regions of substantially the same impurity concentration as that of the p⁻⁻-type JTE region 20 are disposed adjacently to one another at increasingly larger intervals the closer the region is to the chip end. The overall spatial impurity concentration distribution of the spatial modulation region is determined by the ratio of the width to the impurity concentration of the two small regions. Compared to a general JTE structure without a spatial modulation region, the spatial modulation JTE structure 31 is able to ensure a more stable predetermined withstand voltage.

Further, as depicted in FIG. 3A, the edge termination region 60 is formed having a recess that is lower than the active region 50, and the spatial modulation JTE structure 31 is provided in a surface layer of the n⁻-type drift region 2 that is exposed at the bottom of the recess. In this instance, the surface of the spatial modulation JTE structure 31 is at a same height as that of the surfaces of the p⁺-type portion regions 4 in the edge termination region 60.

Further, as depicted in FIG. 3B, the edge termination region 60 is formed having a recess that is lower than the active region 50, and the spatial modulation JTE structure 31 may be provided within the n⁻-type drift region 2 that is exposed at the bottom of the recess. In this instance, the surface of the spatial modulation JTE structure 31 is lower than the surfaces of the p⁺-type portion regions 4 in the edge termination region 60.

Further, as depicted in FIG. 3C, the edge termination region 60 is free of etching and formation of the recess may be omitted, in this instance, the spatial modulation JTE structure 31 is provided in the n⁻-type drift region 2 and the surface of the spatial modulation JTE structure 31 is at the same height as that of the surfaces of the p⁺-type portion regions 4 in the edge termination region 60.

Figure 4:
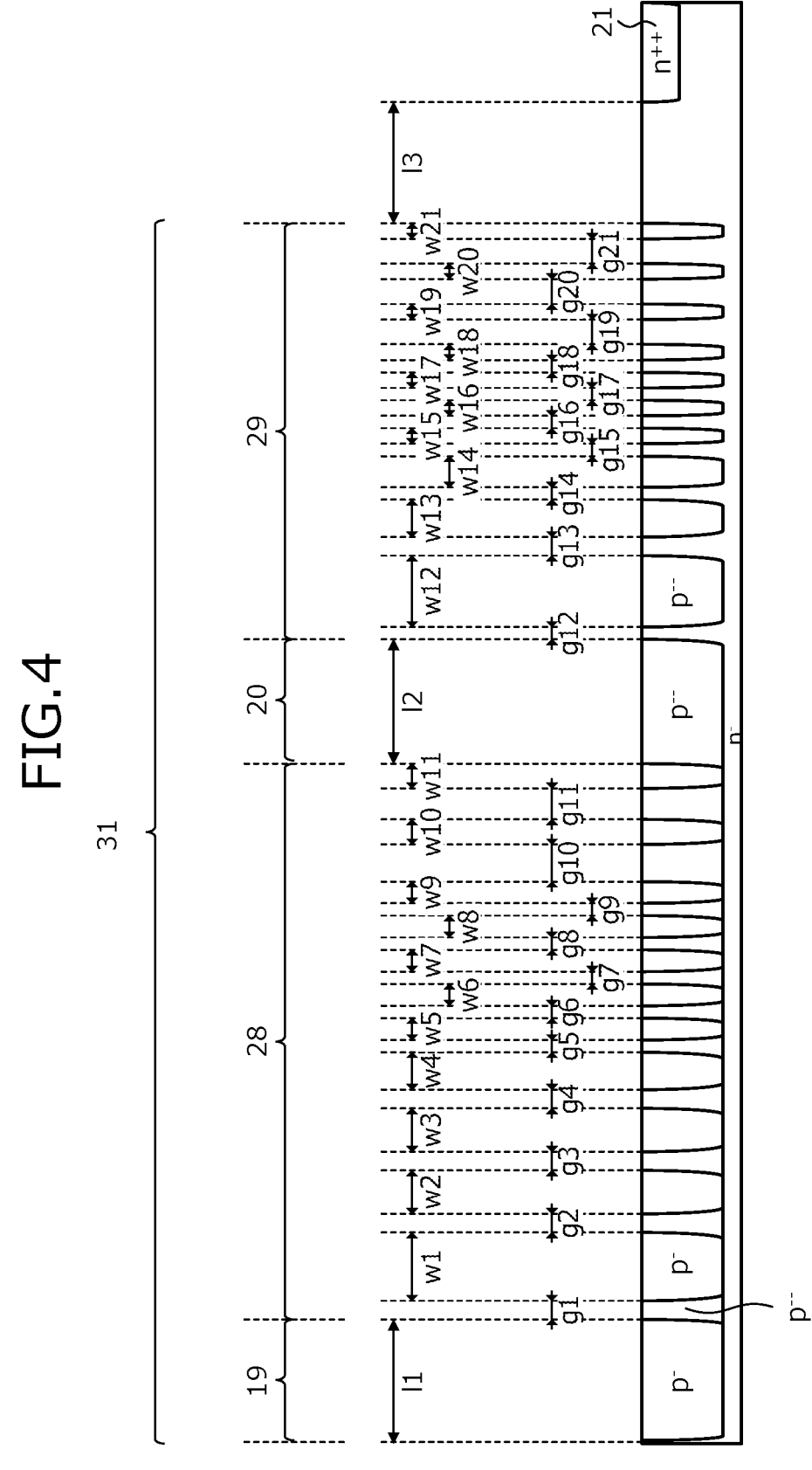
FIG. 4 is a cross-sectional view depicting in detail the edge termination structure of the silicon carbide semiconductor device according to the embodiment.

FIG. 4 is a cross-sectional view depicting in detail the edge termination structure of the silicon carbide semiconductor device according to the embodiment. In the embodiment, the spatial modulation JTE structure 31, from the active region 50 side, is configured by the p⁻-type JTE region (first semiconductor region of the second conductivity type) 19, the first spatial modulation region (second semiconductor region of the second conductivity type) 28, the p⁻⁻-type JTE region (third semiconductor region of the second conductivity type) 20, and the second spatial modulation region (fourth semiconductor region of the second conductivity type) 29. The first spatial modulation region 28 is configured by 11 small regions (first small regions) of a same impurity concentration as that of the p⁻-type JTE region 19, in a region of an impurity concentration lower than that of the p⁻-type JTE region 19. The second spatial modulation region 29 is configured by 10 small regions (second small regions) of a same impurity concentration as that of the p⁻⁻-type JTE region 20. While not depicted, the small regions in the first spatial modulation region 28 and the small regions in the second spatial modulation region 29 are provided in circular concentric shapes that surround the periphery of the active region 50.

In a first configuration of the embodiment, a width 11 of the p⁻-type JTE region 19 is 4.7 μm, a width 12 of the p⁻⁻-type JTE region 20 is 12.7 μm, and an interval 13 between the second spatial modulation region 29 and the n⁺⁺-type channel stopper region 21 is 10 μm.

Further, respective widths w1, w2, w3, w4, w5, w6, w7, w8, w9, w10, and w11 of the small regions of the first spatial modulation region 28 from the active region 50, respective intervals g1, g2, g3, g4, g5, g6, g7, g8, g9, g10, and g11 of the small regions of the first spatial modulation region 28 from the active region 50, respective widths w12, w13, w14, w15, w16, w17, w18, w19, w20, and w21 of the small regions of the second spatial modulation region 29 from the active region 50 side, and respective intervals g12, g13, g14, g15, g16, g17, g18, g19, g20, and g21 of the small regions of the second spatial modulation region 29 from the active region 50 side are as indicated below in Table 1. All units are "μm". A length of the first spatial modulation region 28 is 30 μm and a length of the second spatial modulation region 29 is 29.9 μm. Thus, a length (length from ends of the p⁺-type portion regions 4 to an end of the n⁺⁺-type channel stopper region 21, the end of the n⁺⁺-type channel stopper region 21 facing the active region 50) of the edge termination region 60 in the first configuration of the embodiment is 87.3 μm.

TABLE 1

| w1 | w2 | w3 | w4 | w5 | w6 | w7 | w8 | w9 | w10 | w11 |
|-----|-----|-----|-----|-----|-----|-----|-----|-----|------|------|
| 6.8 | 1.7 | 1.7 | 1.7 | 0.7 | 0.7 | 0.7 | 0.7 | 0.7 | 0.95 | 0.95 |

| g1 | g2 | g3 | g4 | g5 | g6 | g7 | g8 | g9 | g10 | g11 |
|-----|-----|-----|-----|-----|-----|-----|-----|-----|------|------|

TABLE 1-continued

| | | | | | | | | | | |
|---|---|---|---|---|---|---|---|---|---|---|
| 0.7 | 0.85 | 0.75 | 0.8 | 0.85 | 0.75 | 0.85 | 0.75 | 0.8 | 2.85 | 2.75 |
| w12 | w13 | w14 | w15 | w16 | w17 | w18 | w19 | w20 | w21 | |
| 6.8 | 2.7 | 2.7 | 1 | 1 | 1 | 1 | 0.85 | 0.85 | 0.85 | |
| g12 | g13 | g14 | g15 | g16 | g17 | g18 | g19 | g20 | g21 | |
| 0.7 | 1.1 | 1 | 0.9 | 0.8 | 0.9 | 0.8 | 1.7 | 1.6 | 1.65 | |

Further in a second configuration of the embodiment, the width I1 of the $p^-$-type JTE region 19 is 3.7 μm, the width I2 of the $p^{--}$-type JTE region 20 is 7.6 μm, and the interval I3 between the second spatial modulation region 29 and the $n^{++}$-type channel stopper region 21 is 10 μm.

Further, the respective widths w1, w2, w3, w4, w5, w6, w7, w8, w9, w10, and w11 of the small regions of the first spatial modulation region 28 from the active region 50, the respective intervals g1, g2, g3, g4, g5, g6, g7, g8, g9, g10, and g11 of the small regions of the first spatial modulation region 28 from the active region 50, the respective widths w12, w13, w14, w15, w16, w17, w18, w19, w20, and w21 of the small regions of the second spatial modulation region 29 from the active region 50 side, and the respective intervals g12, g13, g14, g15, g16, g17, g18, g19, g20, and g21 of the small regions of the second spatial modulation region 29 from the active region 50 side are as indicated below in Table 2. All units are "μm". The length of the first spatial modulation region 28 is 26.5 μm and the length of the second spatial modulation region 29 is 26.2 μm. Thus, the length of the edge termination region 60 in the second configuration of the embodiment is 74 μm, the same length as that of the edge termination region 160 in the conventional silicon carbide semiconductor device 170.

TABLE 2

| w1 | w2 | w3 | w4 | w5 | w6 | w7 | w8 | w9 | w10 | w11 |
|---|---|---|---|---|---|---|---|---|---|---|
| 5.3 | 1.5 | 1.5 | 1.5 | 0.7 | 0.7 | 0.7 | 0.7 | 0.7 | 0.95 | 0.95 |
| g1 | g2 | g3 | g4 | g5 | g6 | g7 | g8 | g9 | g10 | g11 |
| 0.7 | 0.85 | 0.75 | 0.8 | 0.85 | 0.75 | 0.85 | 0.75 | 0.8 | 2.15 | 2.05 |
| w12 | w13 | w14 | w15 | w16 | w17 | w18 | w19 | w20 | w21 | |
| 5.3 | 2.1 | 2.1 | 1 | 1 | 1 | 1 | 0.85 | 0.85 | 0.85 | |
| g12 | g13 | g14 | g15 | g16 | g17 | g18 | g19 | g20 | g21 | |
| 0.7 | 1.1 | 1 | 0.9 | 0.8 | 0.9 | 0.8 | 1.5 | 1.2 | 1.25 | |

In this manner, in the embodiment, in both the first configuration and the second configuration, the width of the $p^-$-type JTE region 19 is narrower than the width of the $p^{--}$-type JTE region 20. As a result, electric field of the edge termination region 60 may be mitigated without increasing the length of the edge termination region 60.

Further, in the embodiment, both the first configuration and the second configuration have the following features.
(1) The interval g1 between the $p^-$-type JTE region 19 and, of the small regions of the first spatial modulation region 28, an innermost one that is closest to the active region 50, is at most 1.0 μm.
(2) In the first spatial modulation region 28, the respective intervals g2 to g9 between nine of the small regions successively from the active region 50 are at most 1.0 μm.

(3) The respective widths w5 to w1 of the small regions of the first spatial modulation region 28, excluding the first 4 small regions thereof successively from the active region 50, are at most 1.0 μm.
(4) The interval g12 between the $p^{--}$-type JTE region 20 and, of the small regions of the second spatial modulation region 29, an innermost one that is closest to the active region 50, is at most 1.0 μm.
(5) The respective widths w15 to w21 of the small regions of the second spatial modulation region 29, excluding the first 3 small regions successively from the active region 50, are at most 1.0 μm.

Here, an interval between small regions is an interval between a small region and another small region that is adjacent thereto and relatively closer to the active region 50.

Of the features (1) to (5), the features (2) and (4) have the greatest effect on reducing the critical electric field strength in the edge termination structure. Therefore, the features (2) and (4) alone may reduce the critical electric field strength to a greater extent than conventionally.

Figure 5:
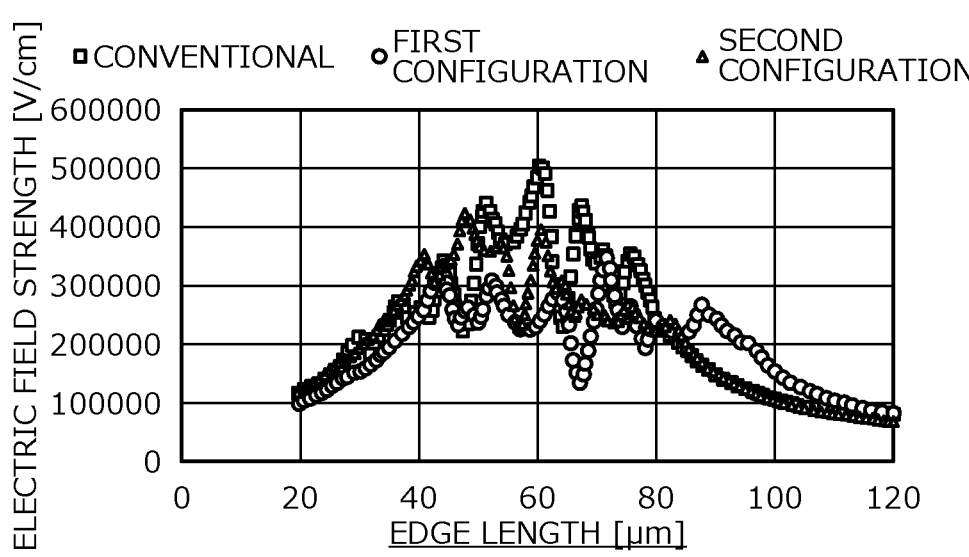
FIG. 5 is a graph depicting electric field strength in the edge termination structures of the silicon carbide semiconductor device according to the embodiment and of a conventional silicon carbide semiconductor device.
Figure 6:
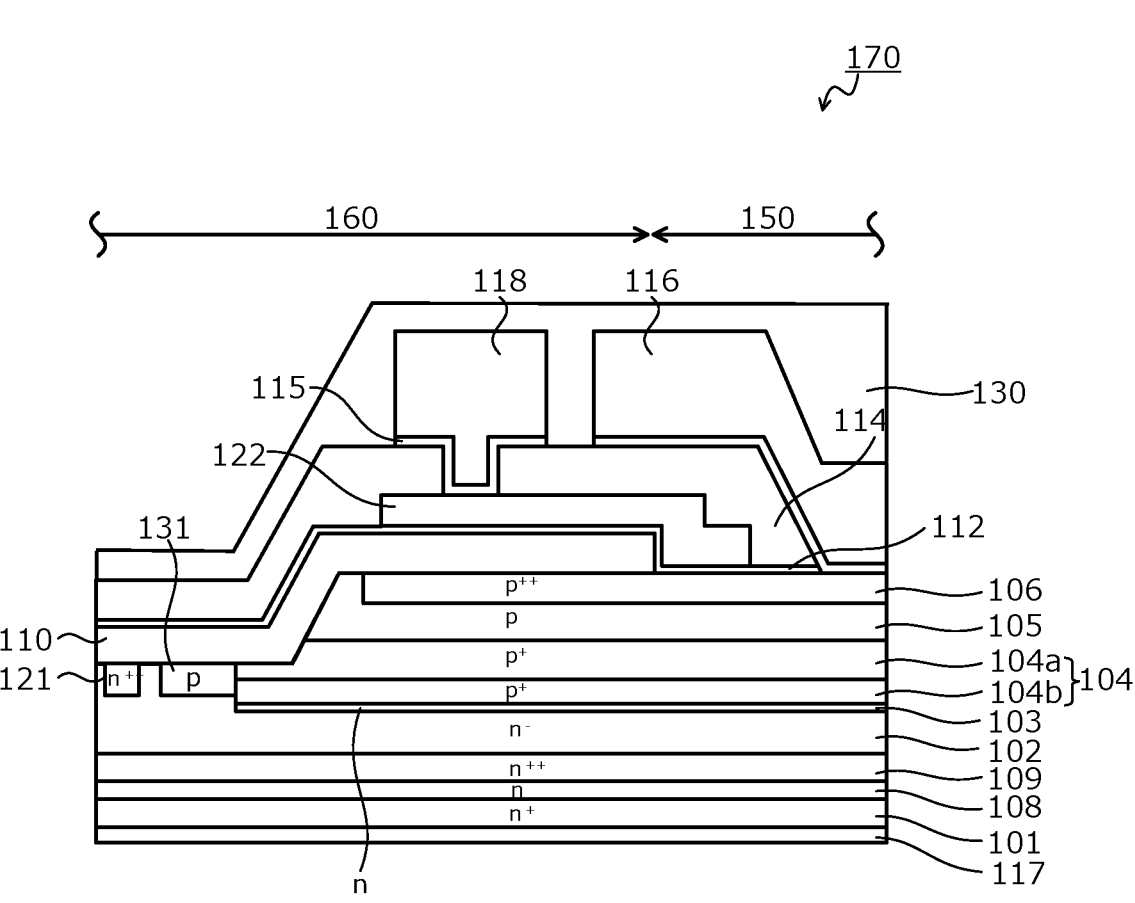
FIG. 6 is a cross-sectional view depicting a structure of the conventional silicon carbide semiconductor device.
Figure 7:
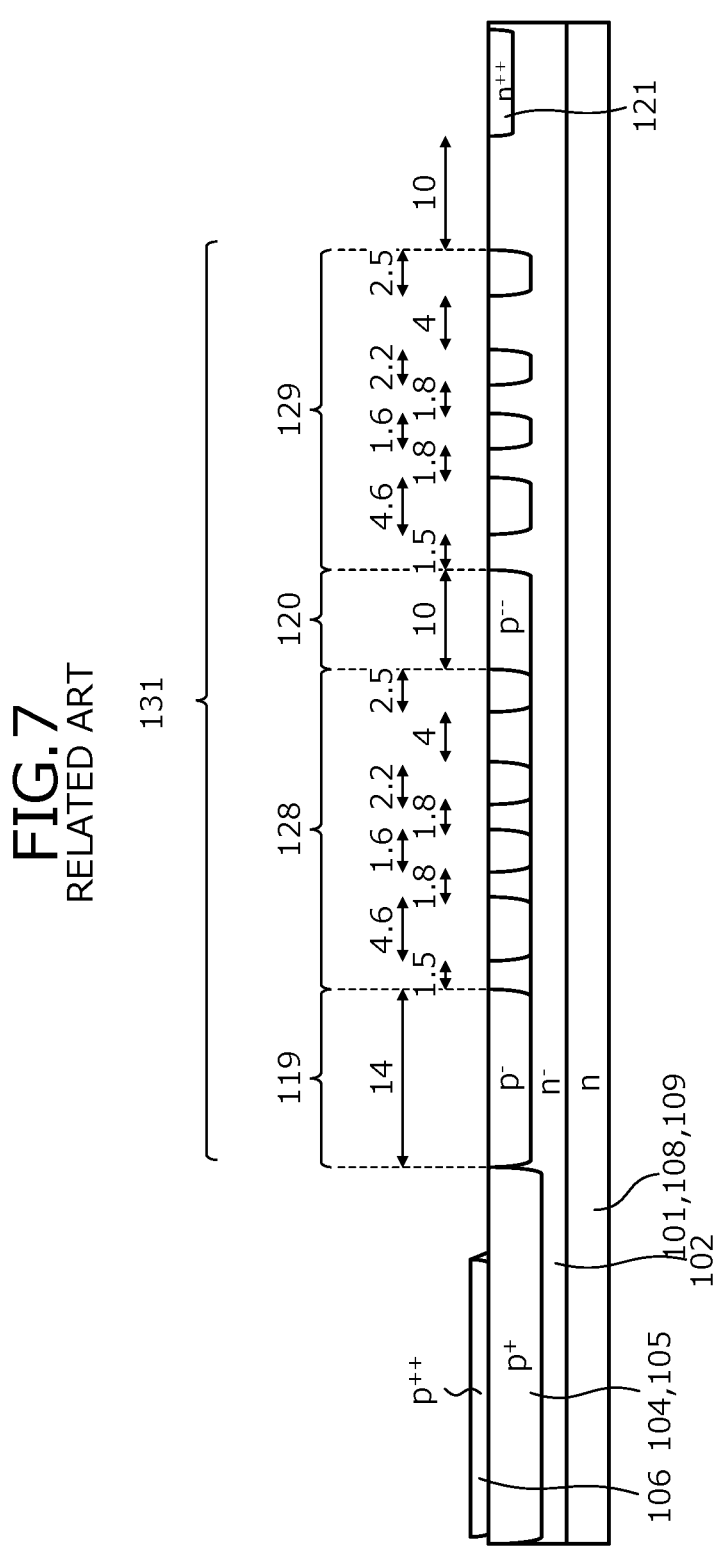
FIG. 7 is a cross-sectional view depicting an edge termination structure that is a combination of a spatial modulation structure and a JTE structure of the conventional silicon carbide semiconductor device.

FIG. 5 is a graph depicting electric field strength in the edge termination structures of the silicon carbide semiconductor device according to the embodiment and of the conventional silicon carbide semiconductor device. In FIG. 5, a horizontal axis indicates edge length from the $p^+$-type portion regions 4, in units of μm. A vertical axis indicates electric field strength of the surface (the HTO film 12/the polyimide 30 interface) of the portion corresponding to edge length, in units of V/cm. FIG. 5 depicts results of simulation of electric field strength in an instance in which the $n^{++}$-type channel stopper region 21 is omitted in the edge termination region 60. In FIG. 5, the edge length of 20 μm corresponds to the end of the $p^-$-type JTE region 19, that faces the active region 50, while 120 μm corresponds to the end of the edge termination region 60.

As depicted in FIG. 5, in the conventional silicon carbide semiconductor device, near an edge length of 60 μm, the critical electric field strength of the surface is at least 0.5 MV/cm, however, in the silicon carbide semiconductor device according to the embodiment, for the first configuration, the critical electric field strength of the surface is about 0.34 MV/cm and for the second configuration, the critical electric field strength of the surface is about 0.42 MV/cm, that is, both are 0.5 MV/cm or less. In the first configuration, the length of the edge termination region 60 is long, whereby the critical electric field strength is lower than that in the second configuration. Further, in the second configuration, the length of the edge termination region 60 is set to be the same as that in the conventional edge termination region 160 and the critical electric field strength of the surface may be set to be 0.5 MV/cm or less.

In this manner, the interval g1 and the interval g12 are set to be 1.0 μm or less, the intervals g2 to g9, the widths w5 to w11, and the widths w15 to w21 are set to be 1.0 μm or less, whereby the critical electric field strength of the surface may be set to be 0.5 MV/cm or less.

In the silicon carbide semiconductor device according to the embodiment, for example, in the $n^-$-type drift region 2 or in a surface layer thereof, the $p^-$-type JTE region 19 of a higher impurity concentration and the first spatial modulation region 28 are formed and thereafter, the $p^{--}$-type JTE region 20 of a lower impurity concentration and the second spatial modulation region 29 are formed, whereby the spatial modulation JTE structure 31 may be formed. Other structures may be fabricated similarly to those in an instance of fabricating, for example, a 1200V MOSFET.

As described above, according to the embodiment, the width of the p⁻-type JTE region is narrower than the width of the p⁻⁻-type JTE region. As a result, without increasing the length of the edge termination region, the electric field in the edge termination region may be mitigated. Further, by the features of the edge termination region of the embodiment, the critical electric field strength of the surface in the edge termination structure may be set to be 0.5 MV/cm or less. Thus, the target value of the THB test may be achieved, and a highly reliable edge termination structure may be provided.

In the foregoing, the present invention may be variously modified within a range not departing from the spirit of the invention and in the embodiments described above, for example, dimensions, impurity concentrations, etc. of parts may be variously set according to necessary specifications. Further, in the embodiment described above, while an instance in which silicon carbide is used as a wide bandgap semiconductor is described as an example, a wide bandgap semiconductor other than silicon carbide, for example, gallium nitride (GaN) or the like is applicable. Further, in the embodiments, while the first conductivity type is assumed to be an n-type and the second conductivity type is assumed to be a p-type, the present invention is similarly implemented when the first conductivity type is a p-type and the second conductivity type is an n-type.

According to the invention described above, the width of the p⁻-type JTE region (first semiconductor region) is narrower than the width of the p⁻⁻-type JTE region (second semiconductor region). As a result, without increasing the length of the edge termination region, the electric field of the edge termination region may be mitigated. Further, by the features of the edge termination region, the critical electric field strength of the surface in the edge termination structure may be set to 0.5 MV/cm or less. Thus, the target value of the THB test may be achieved, and a highly reliable edge termination structure may be provided.

The silicon carbide semiconductor device according to the present invention achieves an effect in that the target value of the THB test may be achieved and high reliability is achieved.

In this manner, the silicon carbide semiconductor device according to the present invention is useful for power semiconductor devices used in power converting equipment such as inverters, power source devices of various types of industrial machines, igniters of automobiles, and the like.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A silicon carbide semiconductor device, comprising:
a silicon carbide semiconductor substrate of a first conductivity type, having an active region through which a main current flows and a termination region that surrounds a periphery of the active region in a top view of the silicon carbide semiconductor device;
a first silicon carbide semiconductor layer of the first conductivity type, provided at a surface of the silicon carbide semiconductor substrate, the first silicon carbide semiconductor layer having an impurity concentration that is lower than an impurity concentration of the silicon carbide semiconductor substrate; and a first semiconductor region, a second semiconductor region, a third semiconductor region, and a fourth semiconductor region that are formed in the termination region, wherein
the first semiconductor region is of a second conductivity type,
the second semiconductor region is of the second conductivity type, and is provided on an outer side of the first semiconductor region in the top view of the silicon carbide semiconductor device, the second semiconductor region having an impurity concentration that is lower than an impurity concentration of the first semiconductor region, the second semiconductor region having a plurality of first small regions of the second conductivity type, the plurality of first small regions having a same impurity concentration as the impurity concentration of the first semiconductor region,
the third semiconductor region is of the second conductivity type, and is provided on an outer side of the second semiconductor region in the top view of the silicon carbide semiconductor device, the third semiconductor region having an impurity concentration that is lower than the impurity concentration of the first semiconductor region,
the fourth semiconductor region is of the second conductivity type, and is provided on an outer side of the third semiconductor region in the top view of the silicon carbide semiconductor device, the fourth semiconductor region having a plurality of second small regions of the second conductivity type, the plurality of second small regions having a same impurity concentration as the impurity concentration of the third semiconductor region,
the first semiconductor region has a width that is narrower than a width of the third semiconductor region, and
the first semiconductor region, the second semiconductor region, the third semiconductor region, and the fourth semiconductor region are provided in the first silicon carbide semiconductor layer at a surface thereof.

2. The silicon carbide semiconductor device according to claim 1, wherein
an interval between the first semiconductor region and one of the first small regions that is closest to the active region is at most 1.0 μm,
in the second semiconductor region, an interval between any adjacent two of nine of the first small regions that are closest from the active region is at most 1.0 μm,
each of the first small regions of the second semiconductor region, except for four of the first small regions that are closest from the active region, has a width that is at most 1.0 μm,
an interval between the third semiconductor region and one of the second small regions that is closest to the active region is at most 1.0 μm, and
each of the second small regions of the fourth semiconductor region, except for three thereof that are closest from the active region, has a width that is at most 1.0 μm.

3. The silicon carbide semiconductor device according to claim 1, further comprising
a recess provided in an outermost portion of the termination region in the top view of the silicon carbide semiconductor device, the outermost portion being lower than the active region.

* * * * *